Oct. 5, 1965 G. A. THOMMES 3,210,187
PHOTOPOLYMERIZABLE ELEMENTS AND PROCESSES
Filed April 28, 1960

*INVENTOR*
GLEN ANTHONY THOMMES

BY Lynn Barratt Morris
*ATTORNEY*

United States Patent Office 3,210,187

Patented Oct. 5, 1965

3,210,187

PHOTOPOLYMERIZABLE ELEMENTS AND PROCESSES

Glen Anthony Thommes, Red Bank, N.J., assignor to E. I. du Pont de Nemours and Company, Wilmington, Del., a corporation of Delaware Filed Apr. 28, 1960, Ser. No. 25,358
8 Claims. (Cl. 96—35)

This invention relates to a process for preparing photopolymerizable elements and more particularly such elements having an integral polymer stratum and to the resulting elements. The invention also relates to a process for modifying polymeric printing reliefs by means of reliefs made from the aforesaid elements.

Photopolymerizable elements which are useful for making printing reliefs are described in Plambeck U.S. Patents 2,760,863 and 2,791,504, and Martin et al. U.S. Patent 2,927,022. The printing reliefs through continued use, however, occasionally become damaged and portions of the relief may break off. Plambeck 2,760,863 discloses that the printing reliefs can be repaired by placing a small amount of a solution of a photopolymerizable composition in the damaged area, exposing the area to actinic radiation to form a polymer area, and working the area, e.g., with engraver's tools, to form the desired relief. This patent also discloses that printing reliefs can be repaired by filling in the damaged area with a photopolymerizable solution, exposing the area to actinic radiation through a negative of the desired image and subsequently removing the unpolymerized areas with a suitable solvent. While these repair techniques are satisfactory, they require that solvent solutions of the photopolymerizable compositions be used. The solvents must be removed by a time-consuming procedure prior to reforming the printing relief. In addition, such techniques are impractical when numerous, different insertions are to be added to a photopolymerized printing relief, e.g., of a business form, newspaper, newsletter, etc.

An object of this invention is to provide a simple and practical process for providing unsupported photopolymerizable sheets with an integral, thin photopolymerized supporting stratum. Another object is to provide such a process which can be controlled to form a supporting stratum of a desired thickness. A further object is to provide photopolymerizable elements that have an integral polymerized support stratum which is resistant to the conventional developer solutions used to form reliefs in the elements. A still further object is to provide such elements which can be used to form relief segments suitable for modifying printing reliefs. Still further objects will be apparent from the following description of the invention.

The process of this invention comprises polymerizing to a thickness of about 2 to about 8 mils an outer stratum of a solid photopolymerizable layer from 10 to 250 mils in thickness essentially comprising (a) an organic polymer binding agent, (b) an ethylenically unsaturated compound containing 1 to 4 terminal ethylenic groups having a boiling point above 100° C. at normally atmospheric pressure, a molecular weight less than 1500 and being capable of forming a high polymer by photoinitiated polymerization, (c) an addition polymerization initiator activatable by actinic light and inactive thermally below 85° C. and preferably below 185° C., and, if desired, (d) an addition polymerization inhibitor. In the layer, the components will be present in the respective parts by weight of 40 to 90, 10 to 60, 0.0001 to 10 and 0.001 to 6.0 parts by weight. Polymerization to the desired depth can be attained by means of light and/or heat or by chemically treating the outer stratum containing an organic peroxide.

In general, the polymerization of the outer lower stratum will be restricted to not more than one-fifth the thickness of the photopolymerizable layer. The polymerization can be carried out by coating or impregnating one surface of the photopolymerizable layer with a solution containing an addition polymerization initiator thermally active below 85° C., e.g., between 60° C. and 80° C. and then either heating the surface to effect addition polymerization or exposing the surface of such a layer, or a layer uncoated or not treated with such a solution, to actinic light of such intensity and duration that polymerization takes place only to the desired depth.

While the invention is particularly useful with unsupported photopolymerizable layers or sheets or plates, layers supported by a thin, flexible transparent strippable film can be exposed through the base to such an extent that only the lowermost 2 to 8 mil stratum of the photopolymerizable layer becomes polymerized.

The photopolymerized stratum of the elements resulting from the above process is resistant to the action of the usual developing solvents and constitutes a permanent base or support for a relief formed in the photopolymerizable stratum. The photopolymerized stratum can be coated with a pressure-sensitive adhesive or an antihalation layer, or provided with a strippable membrane or temporary support. When a pressure-sensitive layer or tape having such a layer on both surfaces is applied, a protective strippable membrane can be applied to such a layer.

Certain of the photopolymerizable elements described above are shown in the attached drawings which constitute a part of this application. In the drawings.

According to a further aspect of this invention, a segment of a photopolymerizable element having a photopolymerized integral stratum adjacent a photopolymerizable layer as described above, is exposed to actinic light imagewise, e.g., through a transparency and converted into a printing relief after the manner described in Plambeck 2,760,863 and the resulting relief is then interfitted with an area or recess in a photopolymerized relief. This recess is made by removing a desired area in the latter relief down to the desired depth. When the segment is used to repair a damaged relief, an area can be removed down to the support. In the case of forms having large open areas, the segment can be adhesively attached to the desired location in the printing relief. Usually, a recess is made in the relief and the segment fitted accurately in the recess so that no lateral movement will occur. The elements of this invention, however, are not limited in their use to the modification (e.g., repair) of damaged printing reliefs.

The invention will be further illustrated by but is not intended to be limited to the following examples.

EXAMPLE I

Figure 1:
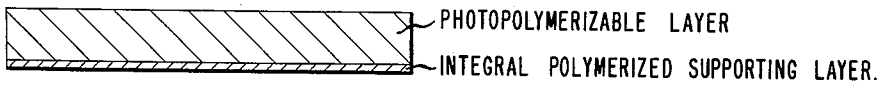
FIG. 1 shows in cross-section the unsupported photopolymerizable element described in Example I.

A photopolymerizable composition was prepared by placing a mixture consisting of 134 g. of cellulose acetate succinate flake, 67 g. of triethylene glycol diacrylate, 0.06 g. of anthraquinone and 0.06 g. of p-methoxyphenol on a rubber mill preheated to 105° C. and milling for about 22 minutes to yield a homogeneous mass. The resulting composition was removed from the rubber mill and was pressed at 170° C. to form a photopolymerizable sheet, 40 mils in thickness. One surface of the sheet was painted with a methyl cellosolve (90% by weight)/benzene (10% by weight) solution of benzoyl peroxide prepared by adding 1.5 g. of the peroxide to a 100 ml. methyl cellosolve/benzene solution. The thermal initiator solution was allowed to evaporate and the sheet was heated to a temperature of 140 to 150° C. for 3 minutes. The photopolymerizable sheet after the heat treatment had a thin polymerized layer about 2 to 3 mils in thickness from one surface; the remainder of the sheet was unpolymerized as illustrated by FIG. 1. The polymerized layer provided an insoluble integral support for the unpolymerized portion of the layer. A 2-inch by 3-inch segment of the photopolymerizable sheet was placed, insolubilized surface down, over a sheet of black paper. A line process negative was placed on the photopolymerizable segment and the assembly was placed in a vacuum frame. The photopolymerizable layer was exposed to 1.75 watts of actinic radiation per square inch for 14 seconds from an 1,800-watt high-pressure mercury arc supported 2 inches from the surface. The photopolymerized sheet section was removed from the vacuum frame and was fastened to a 12-mil thick iron sheet by means of a tape, e.g., regenerated cellulose, coated on each surface with a pressure-sensitive adhesive of the type disclosed in Stow, U.S. Patent 2,925,174, made by the Minnesota Mining & Manufacturing Co., St. Paul, Minn. The unexposed areas of the photopolymerized segment were removed by spray-washing the surface for 8 minutes with an 0.04 N aqueous solution of NaOH maintained at 30° C. The relief image segment was then placed in and adhesively joined by means of the adhesive tape described above to an open area of a photopolymerized, relief printing plate of a business form having a photopolymerized layer thickness of about 52 mils. The inserted segment represented a number which was to be placed on the form. The relief printing element was curved, was mounted on a rotary printing press and was used for printing, good quality reproductions of the relief image being obtained.

It is understood that the insert segment can be removed and other desired segment inserted in the photopolymerized printing element with comparable results being obtained.

EXAMPLE II

Figure 2:
FIG. 2 shows in cross-section the photopolymerizable element described in Example II.

A photopolymerizable composition was prepared as described in Example I. The homogeneous mass was fed into a calendar to yield a photopolymerizable sheet, 40 mils in thickness. During the calendering operation a 5-mil thick sheet of cellulose acetate film was attached to the sheet. The photopolymerizable element formed (see FIG. 2) was exposed for about 2 seconds through the film to radiation from a 1,800-watt high-pressure mercury arc modified by placing an aluminum honeycomb beneath the arc to diminish the radiation intensity so that a 3-mil thick portion of the photopolymerizable layer adjacent to the film support was polymerized, the remainder of the layer being unpolymerized. A two-inch by three-inch segment was cut from the element, a high-contrast line process photographic negative was placed on the surface of the photopolymerizable segment and the assembly was placed in a vacuum frame. The photopolymerizable layer was exposed to the radiation of a high intensity 6000-watt carbon arc for 8 minutes. The unexposed areas of the photopolymerized layer were removed as described in Example I, and the relief insert segment obtained was dried. The cellulose acetate film was stripped from the polymerized layer, and the layer was fastened by means of a commercially available epoxy resin adhesive mixture containing powdered aluminum filler to a corresponding open area in a photopolymerized printing element having a polymerized layer 40 mils thick bonded to an aluminum base support. The resulting modified printing relief was used for printing on a flat-bed press, satisfactory results being obtained.

EXAMPLE III

Figure 3:
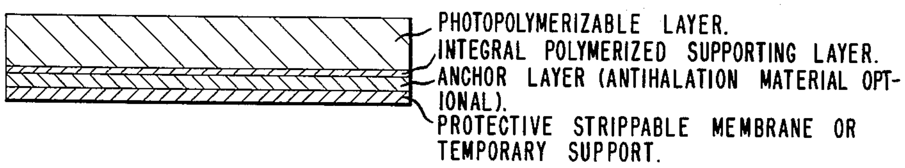
FIG. 3 shows in cross-section the photopolymerizable element described in Example III.

An unsupported photopolymerizable element was prepared as described in Example I except that the photopolymerizable layer thickness was 37 mils. The thin polymerized integral stratum extending inwardly 2 to 3 mils from the surface was formed as described in Example I. A 1-inch by 1-inch segment of the unsupported element was cut from the large element and was coated on its polymerized surface with a copolyester adhesive as described in Example 3 of assignee's Burg application Ser. No. 750,868, filed July 25, 1958 now U.S. Patent No. 3,036,913 granted May 29, 1962, 3 mils in thickness (dry), and a 3-mil thick, strippable protective layer of polyethylene terephthalate was pressed onto the adhesive anchor layer. The thickness of the element is illustrated by FIG. 3, excluding the strippable polyethylene terephthalate protective layer, was 40 mils. A segment was exposed through a process transparency to the radiation of a 6,000-watt carbon arc supported 30 inches from the polymerizable surface of the segment for 5 minutes, and the unexposed area removed by spray-washing for 7 minutes with a 0.04 N aqueous solution of NaOH at 22° C. Upon drying, the protective layer was stripped from the adhesive layer which was then wetted with methyl ethyl ketone, and the 40-mil thick polymerized relief element insert was inserted into a corresponding open area of a photopolymerized printing element having a 40 mil relief as described in Example I. The printing element with the relief segment attached was placed on a rotary press. The element was used for printing 20,000 rotary impressions, satisfactory results being obtained. No creep or movement of the insert was noted during the printing operation.

EXAMPLE IV

Figure 4:
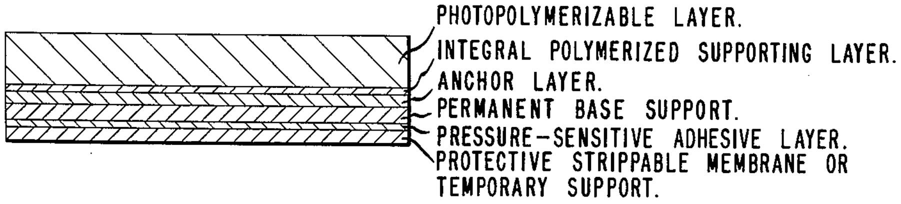
FIG. 4 shows in cross-section the photopolymerizable element described in Example IV.

A photopolymerizable composition was prepared from 30 g. of N-methoxymethyl polyhexamethylene adipamide, 15 g. of glycol dimethacrylate, 0.45 g. of anthraquinone and 0.03 g. of p-methoxyphenol and was formed into a sheet 30 mils in thickness as described in Example 4 of assignee's Saner application Ser. No. 577,829 filed April 12, 1956 now abandoned. The sheet was laminated to a steel sheet 12 mils in thickness, using the copolyester adhesive as described in Example 5 of assignee's Burg application Ser. No. 750,868, filed July 25, 1958. The base portion of the photopolymerizable sheet was polymerized to a depth of 2 mils. Double-coated pressure-sensitive tape as described in Example I was adhered thereto and a strippable layer of a sheet of polyvinyl chloride/acetate was attached to the exposed adhesive surface. The element formed is illustrated by FIG. 4. A one-inch by two-inch segment was cut from the element and was exposed through a line process negative to 1.75 watts of radiation per square inch for 17 seconds from an 1800-watt high-pressure mercury-arc. The unexposed areas of the segment were removed by spray-washing it for 8 minutes with 70% aqueous ethanol at 45° C. Upon drying, the strippable layer was removed, and the relief segment was inserted into a corresponding one-inch by two-inch open area of a photopolymerized printing element having a 42-mil thick relief layer prepared from the photopolymerizable composition described above in this example. The resulting modified printing relief was used for dry-offset printing on a rotary press and gave satisfactory impressions, the insert remaining in position throughout the printing run of 73,000 impressions.

EXAMPLE V

A photopolymerizable composition was prepared as described in Example I, and the homogeneous mass was fed into a calender to yield a photopolymerizable sheet, 30 mils in thickness. The sheet was then exposed in air for 24 hours. A ½ inch wide strip was cut from the sheet and was exposed in steps to the radiation from a 125-watt mercury arc lamp (Hanovia No. 16,200) supported 3.5 inches from the sheet so that a one-half square inch section was exposed for the period of time indicated in the following table. After the respective sections had been exposed, the exposed side of the polymer was rubbed with N,N-dimethyl aniline and was combined with a 12-mil thick iron base sheet support by means of the copolyester adhesive described in Example III. The strip was then spray-washed for 10 minutes with a 0.04 N aqueous solution of NaOH. The thickness of the polymerized area of the photopolymerizable sheet was measured, the following results being obtained:

*Table 1*

| Step | Exposure time (seconds) | Thickness of integral polymerized support stratum (mils) |
|---|---|---|
| 1 | 2 | 0 |
| 2 | 5 | 0 |
| 3 | 10 | 0 |
| 4 | 15 | 0 |
| 5 | 16 | 0 |
| 6 | 17 | 0 |
| 7 | 18 | 4.4 |
| 8 | 19 | 6.2 |
| 9 | 20 | 6.7 |
| 10 | 21 | 6.8 |
| 11 | 25 | 10.2 |
| 12 | 30 | 12.4 |
| 13 | 35 | 15.4 |

EXAMPLE VI

Example V was repeated except that the 30-mil thick strip was placed for 24 hours in a carbon dioxide atmosphere as described in Example I of assignee's Crawford application Ser. No. 787,820 filed Jan. 20, 1959 now abandoned. The following results were obtained at the indicated periods of exposure to the radiation source described in Example V.

*Table 2*

| Step | Exposure time (seconds) | Thickness of integral polymerized support stratum (mils) |
|---|---|---|
| 1 | 2 | 0 |
| 2 | 4 | 0 |
| 3 | 5 | 2.4 |
| 4 | 6 | 10.9 |
| 5 | 7 | 12.3 |
| 6 | 8 | 12.9 |
| 7 | 9 | 13.7 |
| 8 | 10 | 14.2 |
| 9 | 15 | 15.8 |
| 10 | 20 | 18.7 |

The integral polymerized support stratum of a polymerizable layer can be formed using other radiation sources than is described in Examples V and VI. As the intensity of the radiation source increases, however, compensation must be made for the increased intensity (see Example II) or the polymerized stratum will be too thick.

The invention is not limited to the particular photopolymerizable compositions of element structures described in the examples. Photopolymerizable compositions and elements described in Plambeck U.S. Patents 2,760,863 and 2,791,504 are suitable. Additional photopolymerizable compositions which can be used are described in the patents and U.S. applications of assignee as follows:

(1) linear polyamide compositions containing extralinear n-acrylyloxymethyl groups of Saner et al., Ser. No. 753,344 filed August 5, 1958, U.S. Patent 2,972,540, February 21, 1961;

(2) polyvinyl acetal compositions having the extralinear vinylidene groups of Martin, U.S. Patent 2,929,710;

(3) polyester, polyacetal or mixed polyester acetal mixtures of Martin U.S. Patent 2,892,716;

(4) blends of selected organic-soluble, base-soluble cellulose derivatives with addition-polymerizable components and photoinitiators of Martin et al., U.S. Patent 2,927,022;

(5) polyvinyl alcohol derivatives of Martin U.S. Patent 2,902,365;

(6) 1,3-butadiene compositions of McGraw Ser. No. 664,459 filed June 10, 1957 now abandoned and continuation-in-part Ser. No. 833,928 filed August 17, 1959 (U.S. Patent 3,024,180, March 6, 1962);

(7) polymers having extralinear salt forming groups and monomers having complementary salt forming groups of Barney U.S. Patent 2,893,868;

(8) water soluble cellulose ethers and ester derivatives of Martin U.S. Patent 2,927,023;

(9) carbon chain polymers with mediately linked lateral oxyacid groups of Barney, Serial No. 655,192 filed April 26, 1957 (abandoned November 17, 1960) and corresponding British Patent 835,849;

(10) polyether-urethane compositions of Barney Serial No. 693,256 filed October 30, 1957, U.S. Patent 2,948,611, August 9, 1960.

In addition, the following photopolymerizable compositions can be used; cellulose acetate (60 parts by weight), triethylene glycol diacrylate (40 parts by weight), anthraquinone (0.1 part by weight) and p-methoxyphenol (0.1 part by weight). If desired, inert inorganic solid filler materials that are essentially transparent in the layer to actinic radiation can be used, e.g., the organophilic silicas, bentonites, silica, powdered glass, etc., having a particle size less than 0.4 mil in amounts varying with the desired properties of the photopolymerizable layer.

Photopolymerizable compositions useful in this invention have been described. These compositions comprise addition-polymerizable, ethylenically unsaturated compounds, addition-polymerization initiators, and preferably, thermal, addition polymerization inhibitors. Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O—OCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

An addition polymerization initiator activatable by actinic radiation and which is inactive thermally below 85° C. is added in amount of from 0.0001 to 10 parts by weight, preferably 0.001 to 0.2 part by weight based on the weight of the photopolymerizable layer. Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alphahydrocarbon substituted aromatic acyloins including α-methylbenzoin, α-allylbenzoin and α-phenylbenzoin. Preferably, however, the photoinitiators are thermally inactive below 185° C. The anthraquinone photoinitiators fall within this range. In addition to anthraquinone other suitable initiators include 1-chloroanthraquinone, 2-chloroanthraquinone, 2-methylanthraquinone, 2-tert-butylanthraquinone, octamethylanthraquinone, 1,4-naphthoquinone, 1,2-benzanthraquinone, 2,3-benzanthraquinone, 2 - methyl - 1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

A thermal polymerization inhibitor is present in the preferred composition. Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

The above-described photopolymerizable compositions are used to prepare the photopolymerized printing elements and the unsupported insert elements. Preferably the insert elements are of the same composition as the photopolymerizable element in which the insertion or addition is made, but satisfactory results are obtained if different composition insert elements are used.

The thickness of the supported or unsupported photopolymerizable layer can vary from 10 to 250 mils in thickness. The thickness of the layers vary according to the use of the printing elements. Thickness ranges are disclosed in Plambeck U.S. Patent 2,791,504, col. 3, lines 17 to 25.

The insert element which is inserted in a corresponding opening of a photopolymerized printing element can be prepared in various embodiments such as are illustrated by the attached drawings and as are described in the examples. Insert elements in addition to those described in the examples are also useful. Preferably, the element insert is placed in the photopolymerized element after being exposed and washed out. The insert, however, can be inserted in the printing element prior to its exposure and washout, but this can lead to an undesirable swelling of the original element.

The unsupported element, which is a part of this invention, can be formed in several ways. For example, the lower base portion of a photopolymerizable layer can be polymerized by exposing the base with a modified actinic radiation source as described in Example II. Another method of polymerizing a thin area of the photopolymerizable sheet consists of coating the base with a solution containing a thermal addition polymerization initiator and solvent for the polymeric binder, allowing the solution to evaporate and heating the base of the sheet for several minutes at a temperature of 140 to 150° C. (see Example I). Suitable thermal initiators, in addition to benzoyl peroxide, include tertiary-butyl hydroperoxide, acetyl benzoyl peroxide, cumene hydroperoxide, cyclohexanone hydroperoxide, tertiary butyl perbenzoate, di-tertiary-butyl peroxide, etc. Still another method of preparing the unsupported element consists of coating one side of the photopolymerizable sheet with a thermal initiator solution such as the peroxide solutions described above, allowing the coating to dry and applying a thin coating of dimethyl aniline and rubbing dry. The photopolymerizable sheet is then placed in a vacuum frame or an inert atmosphere to eliminate oxygen and the thin polymerized portion of the photopolymerizable element is formed at room temperature.

The base of support materials for the photopolymerized printing elements are preferably flexible and composed of metal, e.g., aluminum or steel plates, sheets and foils, but they can be rigid. Various synthetic film-forming resins or polymers can be used. In addition to cellulose acetate, suitable supports are disclosed in U.S. Patent 2,760,863, col. 5, lines 14 to 33. These supports are also useful with the supported embodiment of the insert element. The supports can be permanently or temporarily adhered to the photopolymerizable layer. The preferred form of the insert element, which is a part of this invention, is unsupported and is described in Example I and is illustrated in FIG. I.

Various anchor layers, as disclosed in U.S. Patent 2,760,863, may be used to give strong permanent adherence between a permanent base and the photopolymerizable layer. The adhesive compositions disclosed in assignee's Burg application Serial No. 750,868 filed July 25, 1958 (U.S. Patent 3,036,913, May 29, 1962) are also very effective.

Many varieties of commercially available thermoplastic, thermosetting or pressure-sensitive adhesives are useful to adhere the insert element to the corresponding open area of a photopolymerized printing element. The adhesive alone or in tape form is coated on or attached to the base or the lower portion of the insert element. The adhesives are also useful for attaching a temporary base support to the photopolymerizable element.

Suitable thermoplastic adhesives include copolyesters, e.g., those prepared from the reaction product of a polymethylene glycol of the formula $HO(CH_2)_nOH$ wherein *n* is a whole number 2 to 10 inclusive, and (1) hexohydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids. Additional copolyester adhesives are disclosed in Williams U.S. Patent 2,765,251. Other thermoplastic adhesives include the acrylate and methacrylate polymers, e.g., polymethyl acrylate and methacrylate, polyethyl methacrylate, polybutyl acrylate and methacrylate, etc.; alkyd polymers; cellulose derivatives, e.g., cellulose acetate, cellulose acetate butyrate, ethyl cellulose, hydroxyethyl cellulose; coumarone-indene resins; polyamides; polystyrenes; vinyl polymers, e.g., polyvinyl acetals such as the acetals obtained by reacting polyvinyl alcohol with formaldehyde, acetaldehyde or butyraldehyde; and polyvinyl acetate.

Thermosetting adhesives useful in the invention which can be used alone or in combination with thermoplastic adhesives include isocyanate polymers, e.g., polyurethanes; melamine polymers, e.g., melamine-formaldehyde and melamine-urea-formaldehyde; phenolic polymers, e.g., phenol formaldehyde, phenolic-polyamide, phenolic-vinyl acetals, etc.; resorcinol polymers, e.g., resorcinol-formaldehyde, resorcinol-urea, resorcinol-phenol-formaldehyde; urea polymers, e.g., urea-formaldehyde; and various commercially available epoxy resins with or without metallic additives, e.g., epoxy compositions disclosed in Mueller et al., U.S. Patent 2,795,572, Hoff et al., U.S. Patent 2,801,229, Steckler U.S. Patent 2,853,468, etc.

Pressure-sensitive adhesives which can be used, particularly in the form of a double-coated tape, include a mixture of para-toluene sulfonamide-formaldehyde resin, polyvinyl acetate and dibutyl phthalate coated on a cellulose tape; a mixture of 15 to 40% polystyrene and 65 to 85% triaryl phosphate such as di-ortho-xenyl-monophenyl phosphate or diphenyl mono-ortho-xenyl phosphate coated on a cellulose sheet or other thin foil; admixtures of polymers such as polyisobutylene, ethyl cellulose, natural and synthetic rubbers with ester gums, hydrogenated resins, alkyds, toluene-sulfonamide-formaldehyde resins and with plasticizers such as soft alkyds, diethyl and dibutyl phthalates, tricresyl phosphate and with modifiers such as mineral waxes, hydrogenated waxes, etc. Also useful is a double-coated pressure-sensitive tape, "Scotch Brand" No. 400, made by the Minnesota Mining & Mfg. Co., St. Paul, Minn. and tape adhesives disclosed in Stow U.S. Patent 2,925,714. Additional useful pressure-sensitive adhesives are disclosed in "The Technology of Adhesives," John Delmonte, Reinhold Publishing Corp., New York, New York, 1947.

An antihalation material can be present in the support, or in a layer or stratum on the surface of the support, or can be contained in the anchor layer. With transparent or translucent supports, the antihalation material may be on the rear surface of the element. When antihalation material is used, it preferably should be sufficiently absorptive of actinic light to permit reflectance from the support or combined support of no more than 35% of incident actinic light.

To form the relief printing elements, the photopolymerizable element is exposed to actinic radiation through a process transparency, e.g., a process negative or positive (an image-bearing transparency consisting solely of substantially opaque and substantially transparent areas where the opaque areas are substantially of the same optical density, the so-called line or halftone negative or positive). To form a relief image on the insert element a negative similar to that described above is used, but the portion of the negative used is restricted to the particular characters to be inserted in the photopolymerized printing element.

The photopolymerizable elements and inserts may be exposed to actinic radiation from any source and of any type. The radiation source should, however, furnish an effective amount of ultraviolet radiation, since free-radical-generating addition-polymerization initiators activatable by actinic radiation generally exhibit their maximum sensitivity in this range. Suitable sources include carbon arcs, mercury-vapor arcs, fluorescent lamps with special ultraviolet-radiation-emitting phosphors, argon glow lamps and photographic flood lamps. Point sources, e.g., the carbon arc, etc., are generally used at distances of 15 to about 40 inches from the photopolymerizable element. Broad radiation sources, e.g., mercury-vapor arc, can be used at a distance up to 24 inches from the photopolymerizable surface. The optimum distance varies, however, depending on the strength of the radiation source and the time required for exposure.

Suitable aqueous washout solutions for the preferred photopolymerizable composition comprising celllulose acetate succinate as the organic polymeric binder include preferably alkali metal hydroxides, e.g., sodium and potassium, and in addition, ammonium, ammonium-substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersion, splashing with paddles and brushing or spraying in removing the unpolymerized areas. Suitable solvents for the other photopolymerizable compositons which are useful in the present invention can be found in their respective patents or applications.

The invention is useful for making repairs in photopolymerized printing elements, e.g., when a letter or word has been damaged. The damaged section of the printing element is removed and is replaced with the appropriate letters or words. The invention is also useful for making printing changes in a photopolymerized printing element. For example, standard business forms are combined in convenient units with two or more copies of the same form and carbon paper between the forms. Each form sheet may be inscribed with a suitable symbol or letter to indicate its designation. By using this invention, a single master plate can be used to print all the forms merely by inserting a new symbol or letter when necessary. The invention is also useful in the printing of newspapers, newsletters and magazines, where it may be necessary to change parts of a page in succeeding editions because of differences in local interests or to insure timeliness of the printed matter. The novel unsupported photopolymerizable insert element described above is particularly useful in this invention.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing and ordinary letterpress printing, the latter requiring greater height differences between printing and non-printing areas and those wherein the ink is carried by the recessed portions of the relief such as in intaglio printing, e.g., line and inverted halftone. The plates are useful for multicolor printing.

Additional uses for the photopolymerizable elements having an integral polymer stratum include such uses as a wrap-around printing plate which can, if necessary, be exposed through an image transparency and the unexposed areas removed while attached to the cylinder, in automotive design mock-up and design of fixtures, for makeready by preparing an image having the opposite orientation to that of a printing plate and placing it under the packing of the impression cylinder, for color transparencies made by exposing sheets to separation negatives or positives and dyeing with suitable dyes which would dye the image in inverse proportion to the extent of polymerization (by superimposing various images, a color transparency could be attained), for preparing sheets of Braille, in the preparation of ornamental plaques, as patterns for automatic engraving machines, foundry molds, name stamps, relief maps; for storing information, e.g., by applying a suitable image of varying width, washing and dyeing; alternatively, the sheet could be dyed first; or by exposing to a variable intensity radiation source and dyeing the unwashed film or strip to give a variable density track.

An advantage of this invention is that it provides a simple and dependable process for forming an integral supporting polymer layer in a photopolymerizable element. Another advantage is that it provides such a process which does not require extra expensive apparatus different from that used in making photopolymerized relief. A further advantage is that it provides such a process which forms an integral lower stratum of polymer which is resistant to or unaffected by the developing solutions used to form reliefs. A still further advantage is that it provides new and useful self-supporting photopolymerizable elements. A still further advantage of the invention is that it provides a practical, simple and quick process for making repairs or modifications in photopolymerized printing reliefs. The process eliminates the use of liquid correction media and the attendant disadvantages. Still other advantages will be apparent to those skilled in the art.

What is claimed is:

1. A process for preparing a photopolymerizable element with a photopolymerizable layer and an integral polymerized supporting stratum and forming an image in said layer which comprises (1) polymerizing an entire outer stratum of a solid photopolymerizable layer from 10 to 250 mils in thickness to a layer of polymer about 2 to 8 mils in thickness but not more than ⅕ the total thickness of the layer, said photopolymerizable layer comprising:

(a) an organic polymer binding agent, (b) an ethylenically unsaturated compound containing 1–4 terminal ethylenic groups, having a boiling point above 100° C. at normal atmospheric pressure, a molecular weight less than 1500, and being capable of forming a high polymer by photoinitiated polymerization, and (c) an addition polymerization initiator activatable by actinic light and inactive thermally below 85° C., said components being present in the respective amounts, by weight, of 40 to 90, 10 to 60 and 0.0001 to 10, whereby another outer photopolymerizable stratum 8 to 242 mils in thickness remain;

(2) exposing the latter outer stratum, imagewise, to actinic light to form a polymer image, and removing the unexposed and unpolymerized image areas of the outer stratum to yield the image in relief.

2. A process according to claim 1 wherein (d) an addition polymerization inhibitor is present in an amount from 0.001 to 6.0 parts by weight.

3. A process according to claim 1 wherein the polymerization is carried out by exposing the outer stratum to actinic light of such intensity and duration that addition polymer is formed only in the 2- to 8-mil outer stratum.

4. A process according to claim 1 wherein the polymerization is carried out thermally by heating the outer stratum to 140° C. to 150° C. for a period sufficient to form insoluble addition polymer only in a 2- to 8-mil outer-stratum.

5. A process according to claim 1 wherein the outer stratum is treated with a solvent containing a thermal addition polymerization initiator activatable below 80° C. and subsequently the same stratum is treated with a chemical solution for a period sufficient to form addition polymer only in a 2–8 mil outer stratum.

6. A process according to claim 1 wherein the outer stratum is treated with a solvent containing a thermal addition polymerization initiator activatable below 80° C. and the treated stratum is heated to 60° C. to 80° C. for a period sufficient to form addition polymer only in a 2- to 8-mil outer stratum.

7. A process according to claim 1 wherein the stratum is contiguous with a strippable, flexible support transparent to actinic light.

8. A process of relief image substitution which comprises (1) polymerizing an entire outer stratum of a solid photopolymerizable layer from 10 to 250 mils in thickness to a layer of polymer about 2 to 8 mils in thickness but not more than ⅕ the total thickness of the layer, said photopolymerizable layer comprising:

(a) an organic polymer binding agent, (b) an ethylenically unsaturated compound containing 1–4 terminal ethylenic groups, having a boiling point above 100° C. at normal atmospheric pressure, a molecular weight less than 1500, and being capable of forming a high polymer by photoinitiated polymerization, and (c) an addition polymerization initiator activatable by actinic light and inactive thermally below 85° C., said components being present in the respective amounts, by weight, of 40 to 90, 10 to 60, and 0.0001 to 10, whereby another outer photopolymerizable stratum 8 to 242 mils in thickness remains;

(2) exposing a segment of the latter stratum, imagewise, to actinic light to form a polymer image and removing the unexposed and polymerized image areas of the outer stratum to yield the image in relief; and (3) removing a corresponding segment containing a corresponding inferior relief image from a printing plate and substituting therefor the segment made in accordance with step (2) of this process.

References Cited by the Examiner

UNITED STATES PATENTS

| | | | |
|---|---|---|---|
| 2,318,959 | 5/43 | Muskat. | |
| 2,403,113 | 7/46 | Muskat et al. | 260—77.5 |
| 2,708,289 | 5/55 | Collings. | |
| 2,760,863 | 8/56 | Plambeck | 96—115 X |
| 3,024,180 | 3/62 | McGraw. | |

FOREIGN PATENTS

| | | |
|---|---|---|
| 789,119 | 11/57 | Great Britain. |
| 802,853 | 10/58 | Great Britain. |

OTHER REFERENCES

Groggins "Unit Processes in Organic Synthesis" 4th ed., 1952, McGraw-Hill, pages 721–727 relied on.

References Cited by the Applicant

UNITED STATES PATENTS

| | | |
|---|---|---|
| 2,684,305 | 7/54 | Quinlivan. |
| 2,845,717 | 8/58 | Somerville et al. |

NORMAN G. TORCHIN, *Primary Examiner.*

MILTON STERMAN, HAROLD N. BURSTEIN, *Examiners.*